US005331289A

United States Patent [19]

Price

[11] Patent Number: 5,331,289

[45] Date of Patent: Jul. 19, 1994

[54] TRANSLINEAR $F_T$ MULTIPLIER

[75] Inventor: Burt L. Price, Brandon, Miss.

[73] Assignee: Tektronix, Inc., Wilsonville, Oreg.

[21] Appl. No.: 14,490

[22] Filed: Feb. 8, 1993

[51] Int. Cl.[5] ............ H03F 3/45

[52] U.S. Cl. ............ 330/252; 307/494

[58] Field of Search ............ 330/110, 252, 254, 261; 307/494, 271

[56] References Cited

U.S. PATENT DOCUMENTS

| | | | |
|---|---|---|---|
| 3,633,120 | 1/1972 | Battjes | 330/252 X |
| 3,931,583 | 1/1975 | Gilbert | 330/252 X |
| 4,065,725 | 12/1977 | Lillis et al. | 330/254 |
| 4,267,516 | 5/1981 | Traa | 330/149 |
| 4,890,067 | 12/1989 | Lamb | 330/149 |
| 5,039,952 | 8/1991 | Dreps et al. | 330/261 |
| 5,065,053 | 11/1991 | Chan et al. | 307/494 X |

*Primary Examiner*—Steven Mottola

*Attorney, Agent, or Firm*—Francis I. Gray; Boulden G. Griffith

[57] ABSTRACT

A translinear $f_T$ multiplier has a pair of differential transistor amplifiers, each pair having commonly coupled emitters, with the base of one transistor of one pair being coupled to the base of one transistor of the other pair and the collectors of the pair being cross-coupled. A diode network provides three parallel diode paths from a reference voltage, two paths being coupled to receive an input signal and to the bases of the other transistors of each pair and the third path being coupled to a constant current source and to the bases of the first transistors of each pair. The resulting circuit configuration accommodates varying transition times.

3 Claims, 2 Drawing Sheets

TRANSLINEAR $F_T$ MULTIPLIER

BACKGROUND OF THE INVENTION

The present invention relates to transistor amplifiers, and more particularly to a translinear $f_T$ multiplier transistor amplifier that allows for variable transition times.

Prior basic multiplier configurations include the Gilbert Multiplier, described with respect to FIG. 9 in U.S. Pat. No. 3,931,583 issued Jan. 6, 1976 to Barrie Gilbert entitled "Wideband Differential Amplifier", which is a four-quadrant multiplier, and the $f_T$ doubler, described in U.S. Pat. No. 3,633,120 issued Jan. 4, 1972 to Carl R. Battjes entitled "Amplifier Circuit", which alternatively doubles the $f_T$ characteristic or the gain of a common emitter-connected transistor amplifier. One limitation of these $f_T$ multiplier configurations in regard to thier use in pin driver output stages, where the amplifier is fully switched from one end of its range to the other, is that they do not allow for variable transition times since the amplifiers are very nonlinear at the extremes of their operating range.

What is desired is an $f_T$ multiplier transistor amplifier configuration that is reasonably linear so it can accommodate virtually any transition time required, from a minimum time to as long as needed.

SUMMARY OF THE INVENTION

Accordingly the present invention provides a translinear $f_T$ multiplier transistor amplifier.

The objects, advantages and other novel features of the present invention are apparent from the following detailed description when read in conjunction with the appended claims and attached drawing.

DESCRIPTION OF THE PREFERRED EMBODIMENT

Figure 1:
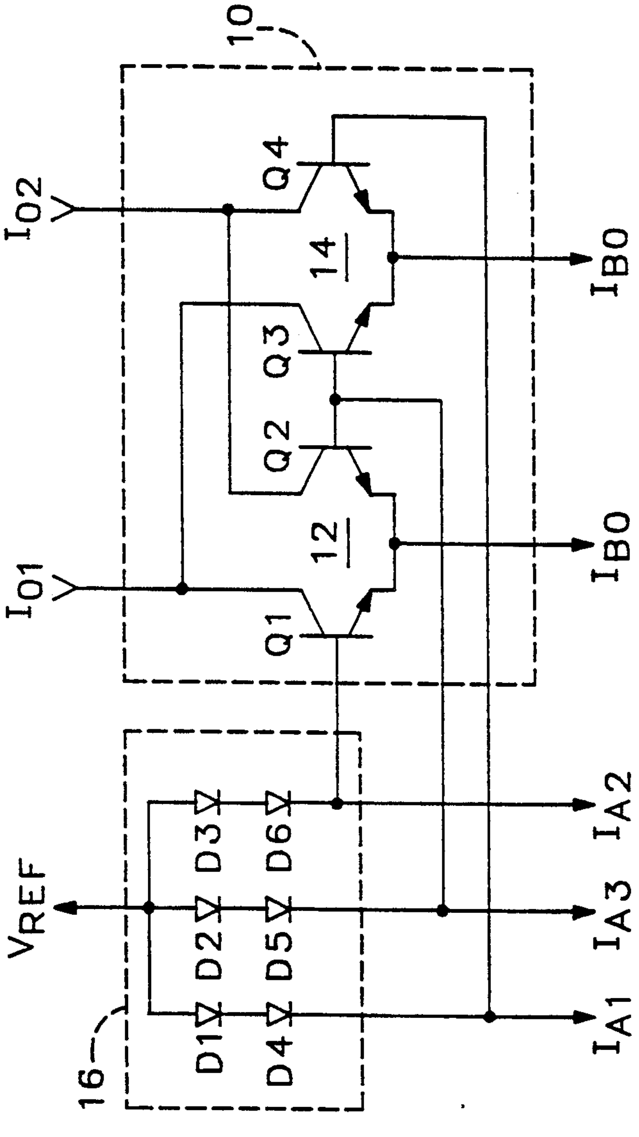
FIG. 1 is a basic schematic diagram of a translinear $f_T$ multiplier according to the present invention.

Referring now to FIG. 1 a differential amplifier 10 that includes two differential pairs of transistors 12, 14 having respective common emitter-connected transistors Q1, Q2 and Q3, Q4. The bases of transistors Q2 and Q3 are coupled together, the collectors of the differential pairs 12, 14 are cross-coupled together to produce output currents $I_{01}$, $I_{02}$, and the emitters are coupled to respective current sources that provide a bias current $I_{BO}$. A diode network 16 has three parallel paths from a reference voltage $V_{REF}$, each path having two diodes in series D1, D4 and D2, D5 and D3, D6 to respective current sources that produce three input currents $I_{A1}$, $I_{A3}$, $I_{A2}$ respectively. Current $I_{A2}$ is applied to the base of transistor Q1, current $I_{A1}$ is applied to the base of transistor Q4, and current $I_{A3}$ is applied to the bases of transistors Q2, Q3.

The equations that describe the translinear $f_T$ multiplier are derived from the circuit of FIG. 1, starting with the following two loop equations:

$$+V_{D4}+V_{D1}-V_{D2}-V_{D5}-V_{be3}+V_{be4}=0$$

$$+V_{D5}+V_{D2}-V_{D3}-V_{D6}-V_{be1}+V_{be2}=0$$

Assuming the forward active case for the Ebers-Moll model for the transistors, the following relationship is used to express the above voltages in terms of diode and transistor currents:

$$V_{Dx,bex}=V_T\ln(I_{Dx,bex}/I_{Sx})$$

Using the above relationship the loop equations are reduced to the following:

$$(I_{A1}{}^2I_{c4})/(I_{A3}{}^2I_{c3})=1$$

$$(I_{A3}{}^2I_{c2})/(I_{A2}{}^2I_{c1})=1$$

Next substitute into the above the following:

$$I_{A1}=I_{I1}+dI_1$$

$$I_{A2}=I_{I1}-dI_1$$

$$I_{A3}=I_{I2}$$

and solve for $I_{01}-I_{02}$, assuming infinite beta and Early voltage, to obtain:

$$I_{01}-I_{02}=(8I_{B0}I_{I1}I_{I2}{}^2dI_1)/[I_{I2}{}^4+2I_{I2}{}^2(I_{I1}{}^2+dI_1{}^2)-+(I_{I1}{}^2-dI_1{}^2)^2[$$

In the above equation the numerator is linear in $dI_1$. The most desirable result is for $I_{01}-I_{02}$ to be strictly a linear function of $dI_1$, but the maximum value of $dI_1$ and the values of $I_{I1}$ and $I_{I2}$ may be adjusted to provide for overall linearity of better than four percent (4%) when fully switching the output currents $I_{01}$, $I_{02}$ in the output differential pairs 12, 14. Linearity to arbitrary accuracies may be achieved by incompletely switching the output currents $I_{01}$, $I_{02}$.

Figure 2:
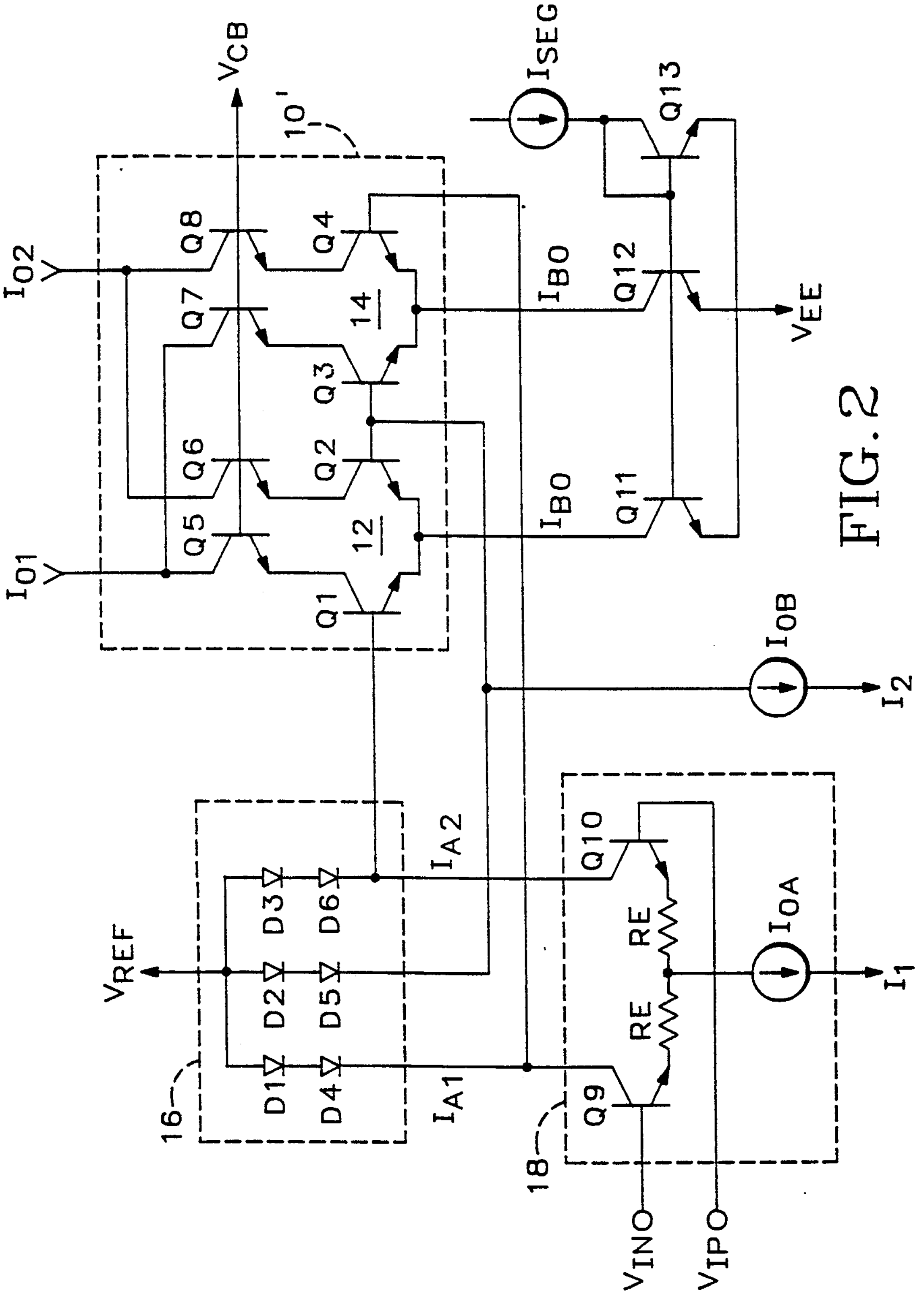
FIG. 2 is a schematic diagram of a practical circuit for a translinear $f_T$ multiplier according to the present invention.

A practical translinear $f_T$ multiplier circuit is shown in FIG. 2. Connected in series in the collector circuits of the differential pairs 12, 14 are output buffer transistors Q5, Q6 and Q7, Q8 respectively with the bases biased in common by a bias voltage $V_{CB}$. A predriver differential amplifier 18 having transistors Q9, Q10 with the emitters coupled via resistors RE to a constant current source $I_{OA}$, providing current $I_1$, has two paths of the diode network 16, namely diodes D1, D4 and D3, D6, as collector loads to provide the input currents $I_{A1}$, $I_{A2}$. A differential input signal voltage $V_{IN}$, $V_{IP}$ is applied to the bases of transistors Q9, Q10. The third path of diodes D2, D5 of the diode network 16 is coupled to another constant current source $I_{OB}$, providing current $I_2$. The bias currents $I_{BO}$ for the differential pairs 12, 14 are provided by respective current source transistors Q11, Q12 coupled in series between the respective common emitters of Q1, Q2 and Q3, Q4 and a voltage rail $V_{EE}$. The current source transistors Q11, 13 are biased at their bases by a bias current source $I_{SEG}$ coupled in series with a diode connected transistor Q13 to the voltage rail $V_{EE}$, the junction between the bias current source and transistor Q13 being coupled to the bases of the current source transistors. Since the differential transistor amplifiers 12, 14 are driven by low resistance diode loads from the diode network 16 in the predriver amplifier 18, the diffusion capacitances of the differential amplifiers may be charged and discharged more rapidly, resulting in a significantly faster transition time of the output currents $I_{01}$, $I_{02}$ over a conventional $f_T$ doubler circuit. Minimum transition time of 150 pSecs may be achieved according to the specific bipolar process used.

In operation currents $I_{A1}$, $I_{A2}$, $I_{A3}$ are set up with identical bias currents so that differential transistor pairs Q1, Q2 and Q3, Q4 have zero volts applied across their bases and their collector currents are equal. As currents $I_{A1}$ and $I_{A2}$ are linearly and differentially varied, diode pairs D1, D4 and D3, D6 develop nonlinear differential voltages across the bases of differential transistor pairs Q1, Q2 and Q3, Q4 which, due to the method of cross-coupling the collectors, creates a differential output current $I_{O1}$, $I_{O2}$. As shown by the loop equations above the differential output current is nearly a linear function of the input currents. The predriver amplifier Q9, Q10 provides a convenient method for generating the input currents $I_{A1}$, $I_{A2}$, and the common base transistors Q5–Q8 improve the speed of the amplifier by reducing the voltage swing on the collectors of transistors Q1–Q4, thereby reducing the Miller capacitance at the bases of those transistors.

The present amplifier provides a minimized voltage headroom requirement since improved linearity is achieved without the use of emitter degeneration resistors in the differential transistor pairs Q1, Q2 and Q3, Q4. Also since the resistance at the bases of the differential transistor pairs is low, the speed of the amplifier is improved. Finally the input current amplitude required to fully switch the amplifier is relatively constant as the output current is varied due to the fact that the current gains of the amplifier, $(I_{O1}-I_{O2})/dI_1$, is proportional to the bias current $I_{B0}$, the output current to be switched.

When used as a pin driver stage the amplifier is fully switched so that when transistors Q1, Q3 are on and conducting all of the current $I_{B0}$, transistors Q2, Q4 are off, and vice versa. To support variable transition times it is important that the transfer function of the amplifier is linear throughout the amplifier operating range between the fully switched states. Then if the input signal amplitude is set just a little larger than the linear range of the amplifier, the output transition accurately follows the input transition no matter what the transition time is. Since the input amplitude needs to be carefully set in this scheme, it is very useful to have the required input amplitude independent of the output current, which is not possible when emitter degeneration transistors are used for improved linearity to set the gain.

Thus the present invention provides a translinear $f_T$ multiplier transistor amplifier that accommodates varying transition times by providing improved linearity without emitter degenerations resistors so that the input signal amplitude is independent of the output current.

What is claimed is:

1. A bipolar translinear $f_T$ multiplier of the type having a pair of differential transistor amplifiers with the emitters of each pair coupled together to a constant current source, with the base of one transistor of the first pair being coupled to the base of one transistor of the second pair, and with the collectors cross-coupled to provide a differential output current comprising:

a diode network having three parallel paths coupled between a reference potential and for two of the paths a differential input signal and for the third path a constant current source, the constant current source being coupled to the one base of each transistor pair and the differential input signal being coupled across the other bases of the first and second pairs.

2. The multiplier according to claim 1 further comprising a differential predriver circuit to which the differential input signal is applied, the output of the differential predriver circuit being applied across the other bases of the pair of differential transistors and being coupled to the two paths of the diode network.

3. The multiplier according to claim 1 further comprising a common-base transistor in series with each collector of the pair of differential transistors for improving the speed of the multiplier by reducing the voltage swing on the collectors.

* * * * *